US009906219B2

(12) United States Patent
Bateriwala et al.

(10) Patent No.: US 9,906,219 B2
(45) Date of Patent: Feb. 27, 2018

(54) ENERGY BYPASS

(71) Applicant: Control Techniques Limited, Newtown (GB)

(72) Inventors: Priyank Nareshchandra Bateriwala, Pune (IN); Dilesh Arvind Raut, Pune (IN); Rajkumar Baburaj, Pune (IN)

(73) Assignee: NIDEC CONTROL TECHNIQUES LIMITED, Newtown (GB)

( * ) Notice: Subject to any disclaimer, the term of this patent is extended or adjusted under 35 U.S.C. 154(b) by 340 days.

(21) Appl. No.: 14/713,350

(22) Filed: May 15, 2015

(65) Prior Publication Data

US 2015/0333750 A1 Nov. 19, 2015

(30) Foreign Application Priority Data

May 15, 2014 (IN) .......................... 1647/MUM/2014

(51) Int. Cl.
*H02J 7/00* (2006.01)
*H03K 17/567* (2006.01)
*H02M 1/36* (2007.01)
*H02J 7/34* (2006.01)

(52) U.S. Cl.
CPC .......... *H03K 17/567* (2013.01); *H02J 7/0081* (2013.01); *H02M 1/36* (2013.01); *H02J 7/345* (2013.01); *Y10T 307/747* (2015.04)

(58) Field of Classification Search
CPC ........ H02J 7/345; H03K 17/567; H02M 1/36; Y10T 307/747
USPC ......................................... 320/166, 128, 124
See application file for complete search history.

(56) References Cited

U.S. PATENT DOCUMENTS

| | | | | |
|---|---|---|---|---|
| 3,569,780 A | * | 3/1971 | Skinner ..................... | B60Q 1/38 315/209 R |
| 3,617,844 A | * | 11/1971 | Grygera .................. | H02P 7/293 388/821 |
| 3,697,975 A | * | 10/1972 | Bernstein ............ | H02J 13/0024 307/140 |
| 3,865,528 A | * | 2/1975 | Roess ..................... | B29C 47/22 425/145 |
| 3,893,007 A | * | 7/1975 | Mori ................... | F02N 11/0848 290/37 R |

(Continued)

FOREIGN PATENT DOCUMENTS

| | | |
|---|---|---|
| KR | 10-2013-0096481 | 8/2013 |
| WO | 2008/088755 | 7/2008 |
| WO | 2009/043373 | 4/2009 |

OTHER PUBLICATIONS

VFD 101; Lesson 3; Parts of a Variable Frequency Drive (VFD); Danfoss; 20 pages.

*Primary Examiner* — Phallaka Kik
(74) *Attorney, Agent, or Firm* — Harness, Dickey & Pierce, P.L.C.

(57) ABSTRACT

An energy bypass circuit for connection between an energy source and a capacitance has first and second relays, a switch, and a resistance. The relays are operable so as to have a first state in which the energy source is not connected to the capacitance, a second state in which the energy source is connected to the capacitance via the resistance, and a third state in which the energy source is connected to the capacitance not via the resistance. The switch is operable, when the relays are in the third state, to enable additional charge stored by the capacitance to discharge via the resistance.

11 Claims, 8 Drawing Sheets

(56) References Cited

U.S. PATENT DOCUMENTS

| | | | | |
|---|---|---|---|---|
| 3,898,447 A | * | 8/1975 | Bozarth, Jr. | G06G 7/161 |
| | | | | 327/261 |
| 3,921,875 A | * | 11/1975 | Hengstler | G06M 3/021 |
| | | | | 377/130 |
| 4,332,977 A | * | 6/1982 | Safford | G09C 3/08 |
| | | | | 380/43 |
| 4,990,889 A | * | 2/1991 | Lebsock | F42C 21/00 |
| | | | | 102/206 |
| 5,355,273 A | * | 10/1994 | Yoshizawa | B60R 16/0239 |
| | | | | 361/105 |
| 6,956,751 B2 | | 10/2005 | Youm et al. | |
| 8,581,535 B2 | | 11/2013 | Gao | |
| 2003/0063481 A1 | | 4/2003 | Kojori | |
| 2003/0107859 A1 | | 6/2003 | Pan et al. | |
| 2004/0090200 A1 | | 5/2004 | Youm | |
| 2004/0136133 A1 | | 7/2004 | Youm | |
| 2010/0033117 A1 | | 2/2010 | Chang | |

* cited by examiner

ENERGY BYPASS

CROSS-REFERENCE TO RELATED APPLICATION

This application claims the benefit and priority of Indian Patent Application No. 1647/MUM/2014 filed May 15, 2014. The entire disclosure of the above application is incorporated herein by reference.

FIELD

This disclosure relates to an energy bypass circuit and method of operating that circuit. In particular, but without limitation, this disclosure relates to an energy bypass circuit that employs a single resistance for both soft starting and braking operations.

BACKGROUND

This section provides background information related to the present disclosure which is not necessarily prior art.

Electrical power can be provided for use in the form of a Direct Current (DC) voltage and also in the form of an Alternating Current (AC) voltage that has been rectified by applying an AC voltage waveform to a half- or full-wave rectifier or bridge rectifier so as to produce a rectified voltage. Power supplies receiving as an input rectified or DC voltages may employ a smoothing capacitance in order to reduce output voltage ripple by releasing stored energy at points when the input supply is providing reduced or no power.

Aspects and features of the present disclosure are set out in the appended claims.

SUMMARY

This section provides a general summary of the disclosure, and is not a comprehensive disclosure of its full scope or all of its features.

The energy bypass circuit described herein uses a single resistance for a plurality of purposes. In particular, the resistance is used for soft start operations, to discharge a capacitance in the event that an inverter feeds energy back into the energy bypass circuit, and to discharge the capacitance in the event that the device is turned off. Discharging the capacitance when the device is turned off is advantageous as it reduces the chances of servicing personnel coming into contact with a charged capacitance during servicing operations. Furthermore the resistance may also be used to discharge the capacitance quickly in the event of a power failure to the control circuitry—for example, discharge may occur within 5 seconds. In particular, if the voltage supply to the control circuitry is turned off or interrupted, then any relay coil that is energised will de-energise thereby causing its armature to connect its common terminal to its normally closed terminal—thereby enabling any charge stored at the capacitance to discharge via the resistance. As the coils of both relays are arranged to be energised by the control circuitry, in the event that both relays are energised when the power supply to the control circuitry is disconnected, then firstly the second relay 134 and then, after some delay, the first relay 122 will de-energise and hence the armatures of the relays will sequentially return to connect their respective common and normally closed terminals. By so returning, the capacitance is not shorted out directly by only the relays—instead, it is shorted by the resistance—and so wear and/or damage to the relay contacts that would otherwise occur is avoided.

The arrangement of the relays within the energy bypass circuit is such that, when neither of the coils of the two relays is energised, the capacitance is disconnected from the energy source that would otherwise supply energy to the capacitance and inverter. Such a power interlock arrangement is particularly advantageous in circumstances where the power supply to the control circuitry fails but the energy source does not as, in such circumstances, the energy source would otherwise be able to continue to supply energy (which may include dangerously high voltages) to the energy bypass circuit.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
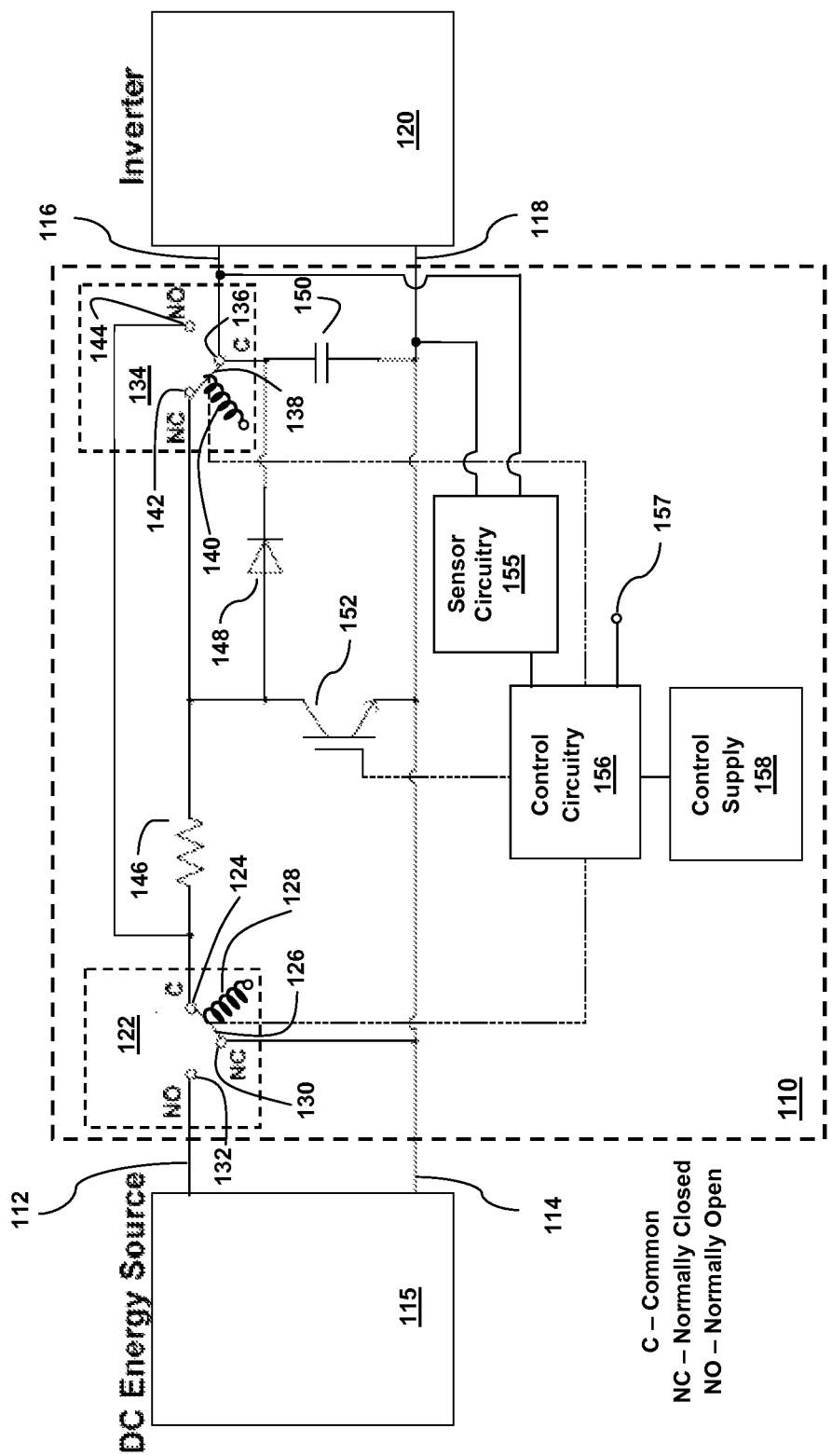
FIG. 1 shows an exemplary circuit diagram of an energy bypass circuit in a first state.

FIG. 1 shows an exemplary circuit diagram of an energy bypass circuit 110 connected via first and second power input connections 112, 114 to a DC energy source 115. The energy bypass circuit 110 further comprises first and second output connections 116, 118 which connect the energy bypass circuit 110 to an inverter 120. The inverter may be a part of an AC drive such as an AC servo drive (not shown).

The energy bypass circuit 110 comprises a first relay 122 comprising a first common terminal 124, a first armature 126, a first coil 128, a first normally closed terminal 130, and a first normally open terminal 132. The first relay 122 is arranged so that when the first coil 128 is not energised, the first armature 126 connects the first common terminal 124 to the first normally closed terminal 130 so that the electrical current may flow therebetween. The first relay 122 is further arranged so that, when the first coil 128 is energised, the first armature 126 connects the first common terminal 124 to the first normally open terminal 132 so that electrical current may flow therebetween.

The energy bypass circuit 110 further comprises a second relay 134 having a second common terminal 136, a second armature 138, a second coil 140, a second normally closed terminal 142, and a second normally open terminal 144. The second relay 134 is arranged so that when the second coil 140 is not energised, the second armature 138 connects the second common terminal 136 to the second normally closed terminal 142 so that the electrical current may flow therebetween. The second relay 134 is further arranged so that, when the second coil 140 is energised, the second armature 138 connects the second common terminal 136 to the second normally open terminal 144 so that electrical current may flow therebetween.

In FIG. 1, the first common terminal 124 is connected to the second normally closed terminal 142 via a resistance 146, in this case a resistor. The first common terminal 124 is also connected to the second normally open terminal 144. The second normally closed terminal 142 is connected to the anode of a diode 148, the cathode of which is connected to the second common terminal 136. The second common terminal 136 is connected to the first output connection 116 and is also connected to the second output connection 118 via a smoothing (or bulk) capacitance 150 (in this case a capacitor). The first normally closed terminal 130 is connected to the second power input connection 114 and also to the second output connection 118. The first normally open terminal 132 is connected to the first input connection 112. A switch 152, in this case an Insulated Gate Bipolar Transistor (IGBT) has its collector connected to second normally closed terminal 142 and its emitter connected to the second power input connection 114. Sensor circuitry 155 is connected to the first and second power output connections 116, 118 and is arranged to sense the voltage across the capacitance 150 and, when the sensed voltage exceeds a predetermined threshold, signal that information to control circuitry 156. The control circuitry 156 is also connected to the first and second coils 128, 140 and also to the gate of the switch 152. The control circuitry 156 is powered by a control supply 158.

At start up the first and second coils 128, 140 will not be energised and so the first common terminal 124 will be connected to the first normally closed terminal 130 via the first armature 126 and the second common terminal 136 will be connected to the second normally closed terminal 142 via the second armature 138. Accordingly, the DC energy source 115 will be isolated from both the capacitance 150 and the inverter 120 and so no energy will flow from the DC energy source 115 to either the capacitance 150 or the inverter 120.

The relay armature arrangement of FIG. 1 (a first (disconnected) state of the energy bypass circuit 110) may also occur in the event that there is a failure or deficiency in the control supply 158 such as to cause the control circuitry 156 to fail to be able to energise either the first coil 128 or the second coil 140. In such circumstances, if the first armature 126 is not already positioned to connect the first common terminal 124 with the first normally closed terminal 130, then the first armature 126 will move to such a position; likewise, in such circumstances, if the second armature 138 is not already arranged so as to connect the second common terminal 136 with the second normally closed terminal 142 then the second armature 138 will move to such a position.

Furthermore, the relay armature arrangement of FIG. 1 may also occur when it is decided to disconnect the inverter 120 from the DC energy source 115.

Figure 2:
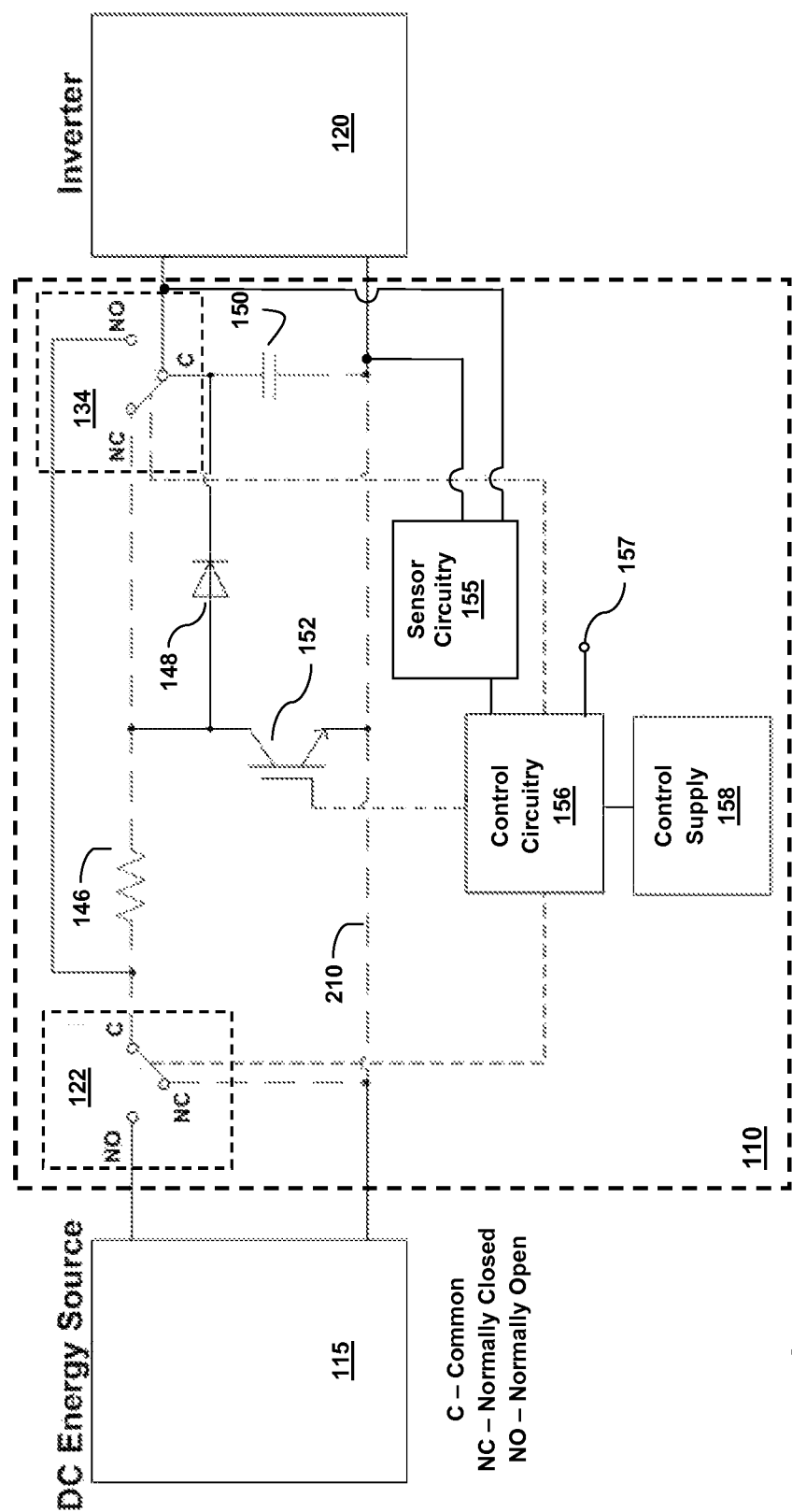
FIG. 2 illustrates a current pathway in the circuit of FIG. 1.

In the event that one or both of the first and second armatures 126, 138 move so that the energy bypass circuit 110 has the relay armature arrangement of FIG. 1 and there is at that point any charge stored on the capacitance 150, then that charge will discharge from the capacitance 150 via the second relay 134, the resistance 146, and the first relay 122. FIG. 2 illustrates, using a large dashed line 210, the parts of a circuit of FIG. 1 by which charge stored on the capacitance 150 would so discharge.

Figure 3:
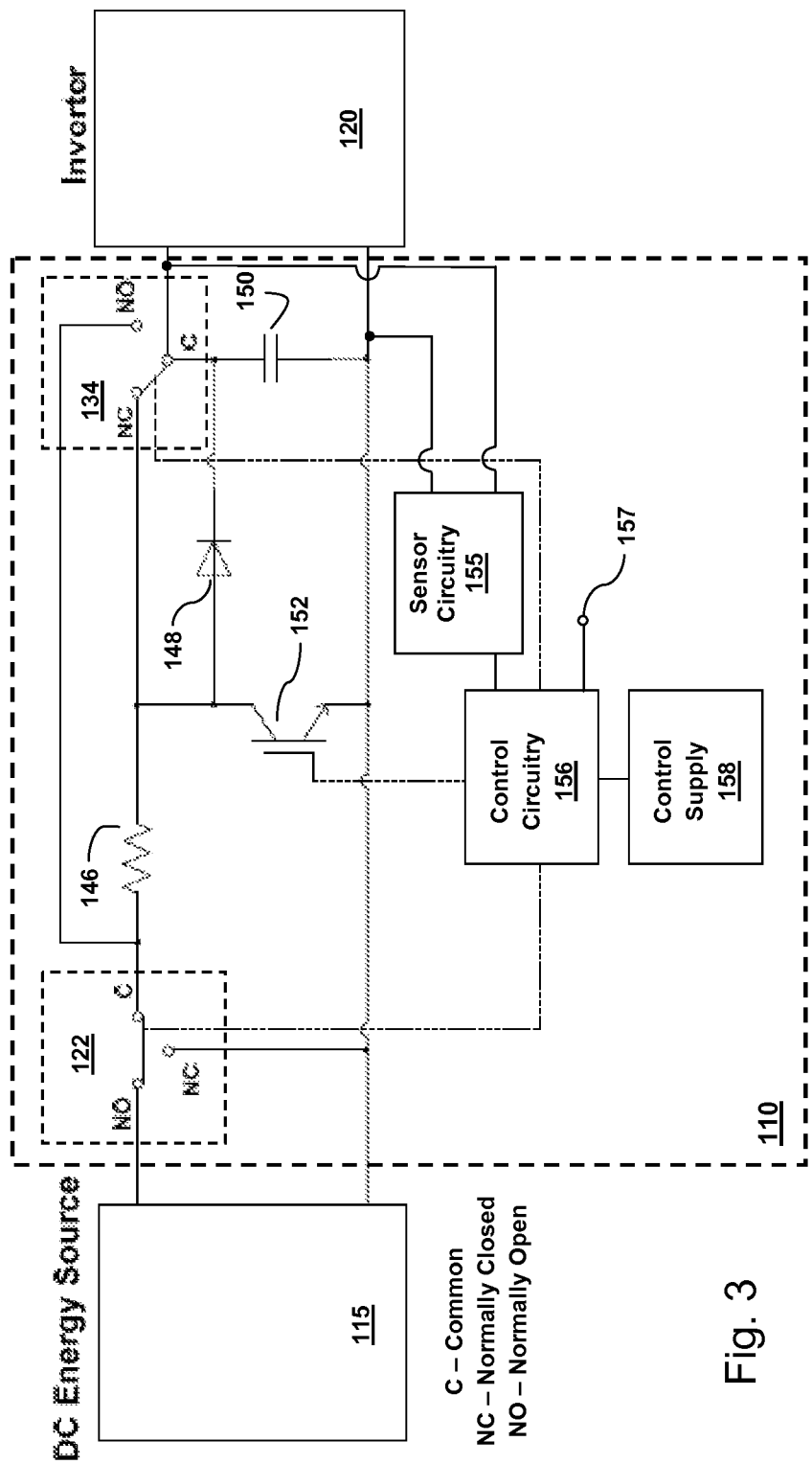
FIG. 3 shows the energy bypass circuit in a second state.
Figure 4:
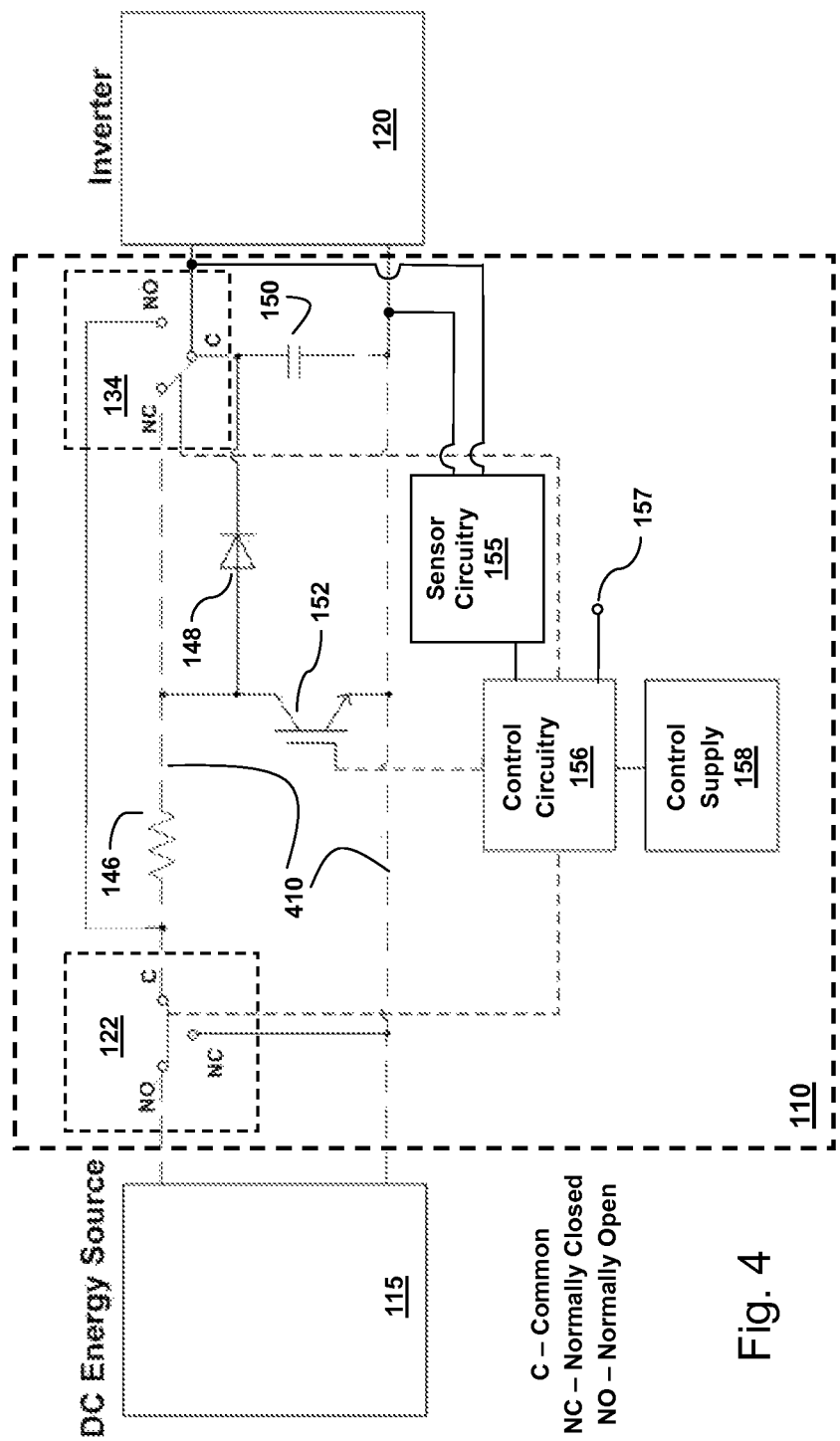
FIG. 4 shows a current pathway in the circuit of FIG. 3.

The control circuitry 156 is arranged to receive a signal via a sensor terminal 157, the signal indicating that the inverter 120 should be provided with energy from the DC energy source 115. When the control circuitry 156 receives such a signal, the control circuitry 156 energises the first coil 128 so as to connect the first common terminal 124 with the first normally open terminal 132 by way of the first armature 126—as illustrated by the relay armature arrangement of FIG. 3 (a second (soft start) state of the energy bypass circuit 110). The control circuitry 156 does not at this stage energise the second coil 140. Accordingly, energy is able to flow from the DC energy source 115 via the first relay 122, the resistance 146, and the second relay 134, to the capacitance 150 and therefore also the inverter 120. By initially providing current to the capacitance 150 via the resistance 146, the resistance 146 limits the amount of (inrush) current that the capacitance 150 can initially draw thereby enabling a 'soft start' at turn on. FIG. 4 illustrates, using a large dashed line 410, the parts of a circuit of FIG. 3 by which current may flow to the capacitance 150. Note that, in FIG. 4, current does not flow via diode 148 and so, although there will be some resistive energy loss due to current flowing via the resistance 146, there will be no diode energy loss.

Also, during parallel operation of drives in servo applications, there will be a high amount of current (due to the paralleled drives capacitance) through the resistor during soft start. In such cases another high wattage external resistor can be connected in parallel across the internal resistor (146).

The sensor circuitry 155 is arranged to monitor the voltage across the capacitance 150 and, following turn on, signal to the control circuitry 156 when that voltage has reached a value indicating that the soft start consequences of having the capacitance 150 supplied via the resistance 146 are no longer required. As one example, the value of the voltage used to indicate that soft starting is no longer required is 60% of the voltage that the DC energy source 115 is specified to supply. As other possibilities, a current provided by the DC energy source 115, or a period of time that has elapsed since soft starting may be used to determine that soft starting is no longer required. On receipt of such a signal, the control circuitry 156 energises the second coil 140 so that the second common terminal 136 is connected via the second armature 138 to the second normally open terminal 144 and so current can be provided from the DC energy source 115 to the capacitance 150 without passing through the resistance 146 (the resistance is bypassed). Such an armature arrangement (a third (normal operation) state of the energy bypass circuit 110) is illustrated in FIG. 5 which represents the circuit in its normal operation configuration.

In certain circumstances, for example during braking of a motor (not shown) that is powered by the inverter 120, energy may be fed back from the inverter 120 into the energy bypass circuit 110. In such circumstances, the voltage across the capacitance 150 will increase which could potentially damage the capacitance 150, the energy bypass circuit 110, and/or the DC energy source 115. The sensor circuitry 155 is arranged to detect such an increase—for example by detecting when the voltage across the capacitance exceeds a predetermined threshold—and signal the detection to the control circuitry 156. When the energy bypass circuit 110 is in the third state and the control circuitry 156 is in receipt of such a signal, the control circuitry 156 sends a pulsed signal to the switch 152 to cause the switch 152 to repeatedly open and shut.

When the energy bypass circuit 110 is in the third state and the switch 152 is closed, charge stored at the capacitance 150 is able to discharge via the second relay 134, the resistance 146, and the switch 152. When the switch 152 opens, energy that has been stored within the resistance 146 and the associated circuit pathways due to the inductance thereof (for example PCB track inductance) causes a voltage spike that discharges via the resistance 146, second relay 134 and the diode 148—which acts as a free-wheeling diode. Accordingly, in such circumstances energy stored in the resistance 146 and the associated circuit pathways is dissipated through only one of the two relays—the second relay 134—and so power is then only cycled through the second relay 134 and so it is only that relay that will be stressed thereby avoiding component-life reducing stress occurring to the first relay 122.

Figure 5:
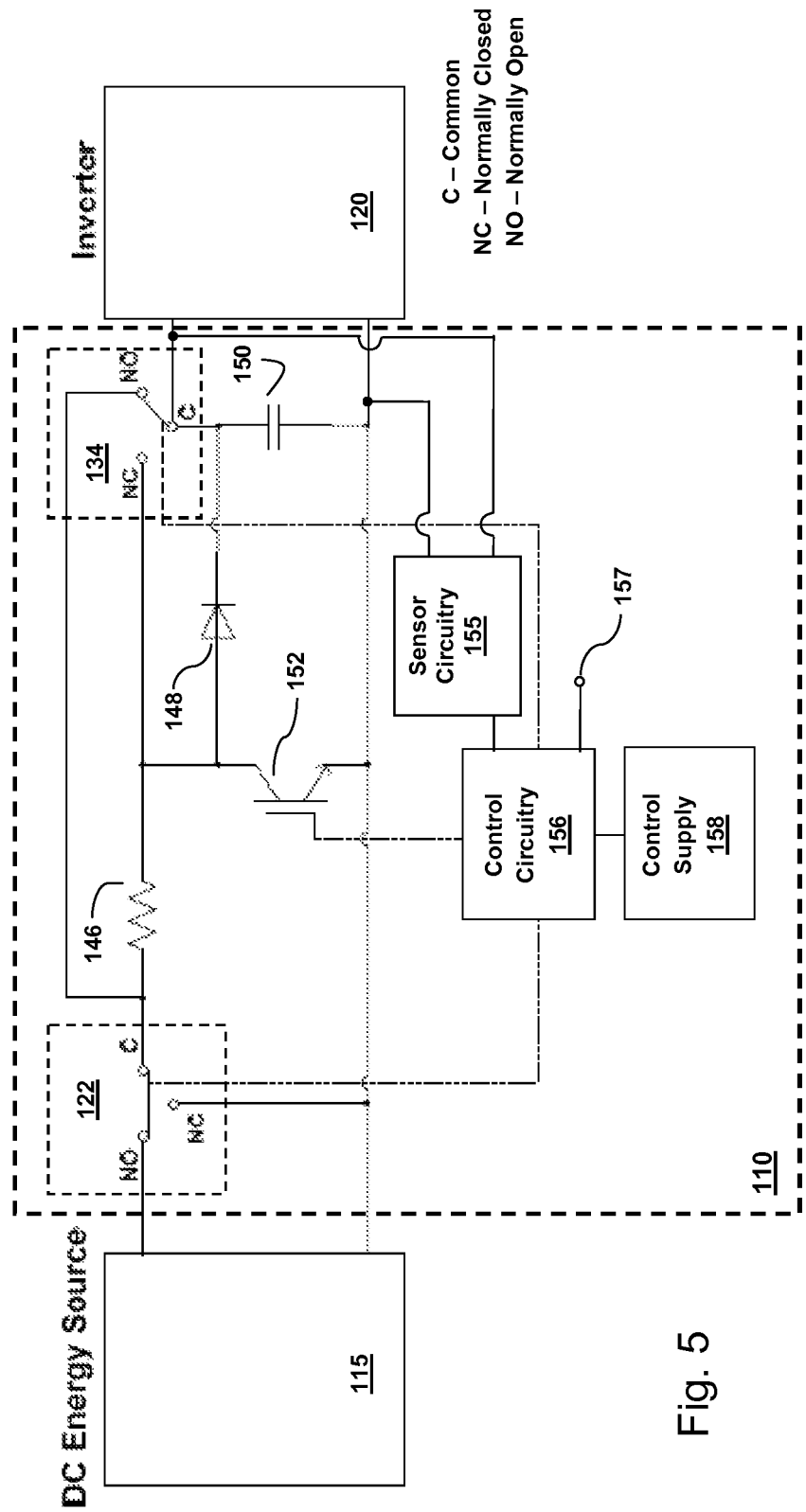
FIG. 5 shows energy bypass circuit in a third state.
Figure 6:
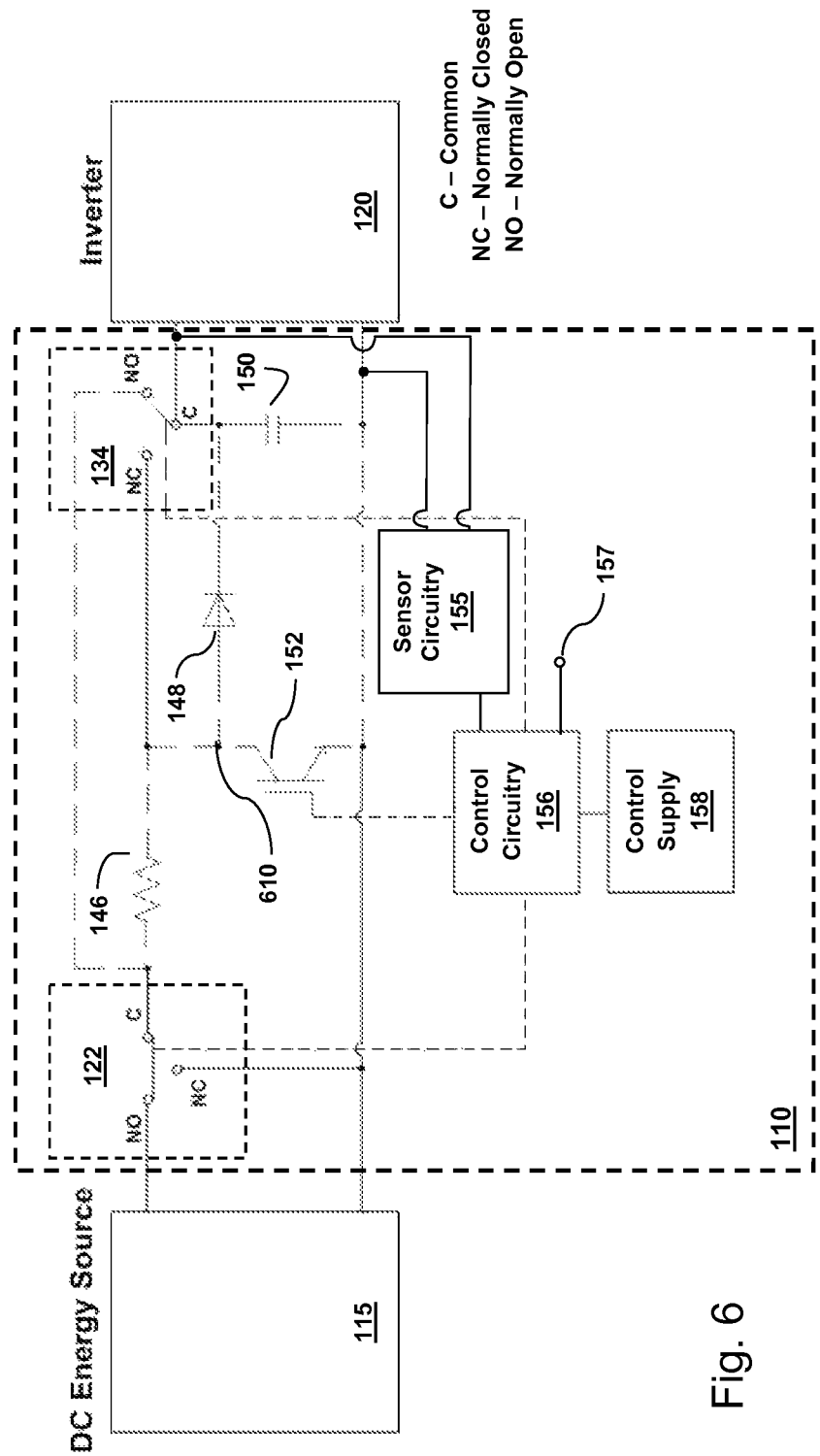
FIG. 6 shows a current pathway in the circuit of FIG. 5.

FIG. 6 illustrates, using a large dashed line 610, the parts of a circuit of FIG. 5 by which current may flow when the energy bypass circuit 110 is in the third state and a pulsed signal is sent to the switch 152.

Figure 7:
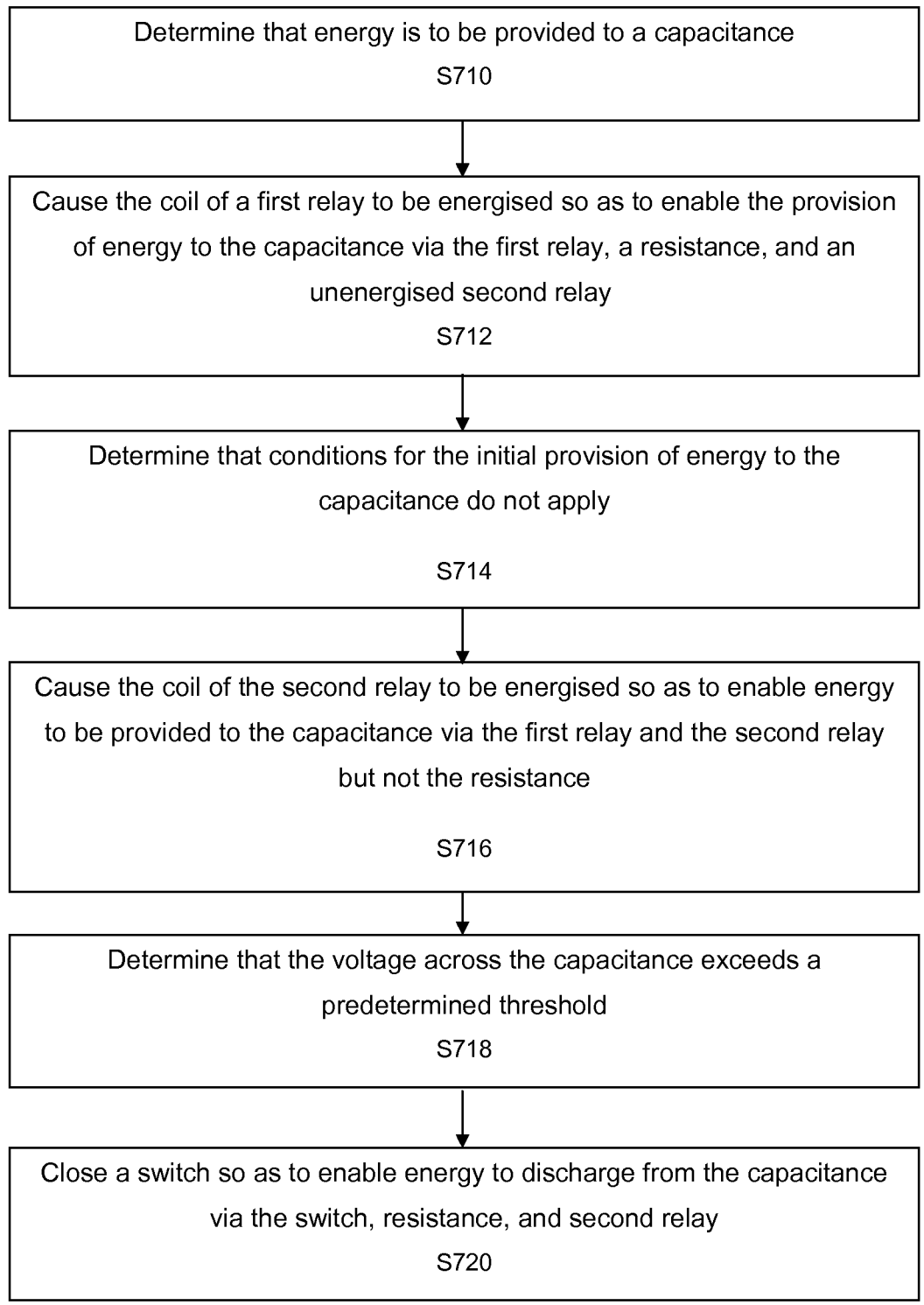
FIG. 7 shows a flow chart illustrating the steps of a method of controlling an energy bypass circuit.

FIG. 7 demonstrates the steps of a method of controlling an energy bypass circuit. At step S710, it is determined that energy should be provided to an inverter and consequently also to a smoothing capacitance connected across the terminals of the inverter. At step S712, the coil of a first relay is energised so as to enable energy to be provided via the first relay, a resistance, and a second relay to the capacitance. At step S714, it is determined that the conditions for the initial provision of energy to the capacitance no longer apply and so, at step S716 the coil of the second relay is energised so as to enable energy to be provided to the capacitance via the first relay and the second relay but not the resistance. At step S718, it is determined that the voltage across the capacitance exceeds a predetermined threshold—for example, that associated with the inverter feeding energy back into the energy bypass circuit and, at step S720, a switch is closed so as to enable energy to discharge from the capacitance via the switch, the resistance, and the second relay.

Figure 8:
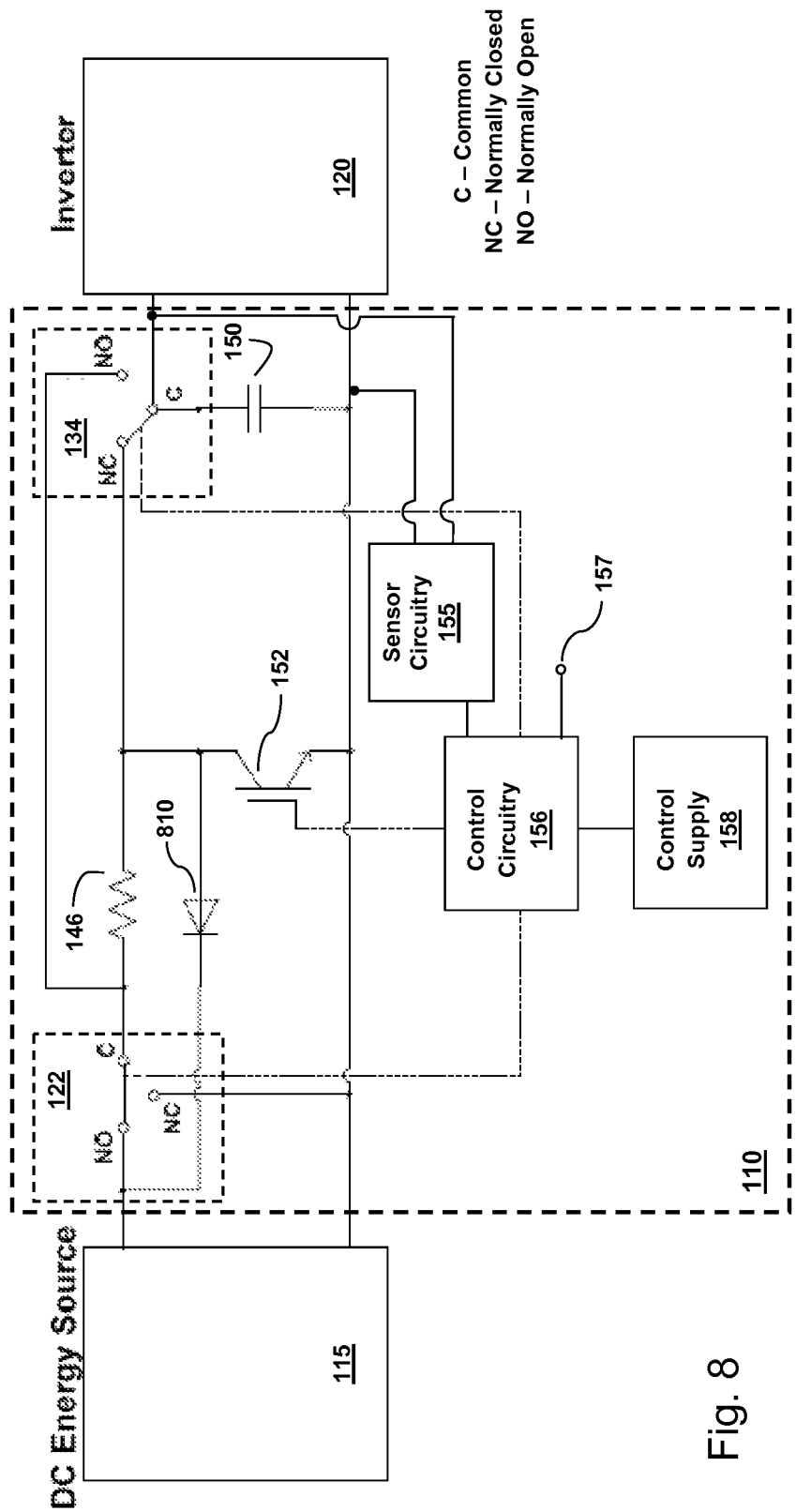
FIG. 8 shows an exemplary circuit diagram of another energy bypass circuit.

FIG. 8 shows an alternative embodiment wherein the energy bypass circuit 110 does not include diode 148 and instead includes diode 810 which has its anode connected to the second normally closed terminal 142 and its cathode connected to the first normally open terminal 132. Operation of the circuit of FIG. 8 is the same as for that of FIG. 1 with the exception that, when the switch 152 is being pulsed and has turned off, energy that has been stored within the resistance 146 and the associated circuit pathways due to the inductance thereof discharges via the first relay 122 and the diode 810—which acts as a free-wheeling diode.

Although the above has been described with reference to the switch 152 being an insulated gate bipolar transistor, other switches could equally be employed for example other semiconductor switches such as a MOSFET (Metal Oxide Semiconductor Field Effect Transistor), a GTO (Gate Turn Off thyristor), or an IGCT (Integrated Gate Commutated Thyristor).

A skilled person will appreciate that capacitance 150 may comprise a single capacitor or may be formed from a plurality of capacitors which may be connected in parallel and/or series.

Although the above has been described with reference to the sensor circuitry 155 sensing the voltage across the capacitance 150, as another possibility, the sensor circuitry could sense a voltage that is representative of the voltage across the capacitance 150—for example as may be produced by a potential divider connected across the capacitance 150 or, in the event that the capacitance 150 is made up of a plurality of capacitors, by sensing a voltage across one or more of those capacitors.

A skilled person will understand that the term 'connected' has been used herein to explain the electrical connection of different circuit components.

There is disclosed herein an energy bypass circuit for connection between an energy source and a capacitance that has first and second relays, a switch, and a resistance. The relays are operable so as to have a first state in which the energy source is not connected to the capacitance, a second state in which the energy source is connected to the capacitance via the resistance, and a third state in which the energy source is connected to the capacitance not via the resistance. The switch is operable, when the relays are in the third state, to enable additional charge stored by the capacitance to discharge via the resistance.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An energy bypass circuit comprising:
 a first relay having a first common terminal, a first normally open terminal, a first normally closed terminal, a first armature, and a first coil, the first armature being connected to the first common terminal and being arranged to connect the first common terminal to the first normally open terminal when the first coil is energised and to otherwise connect the first common terminal to the first normally closed terminal;
 a second relay having a second common terminal, a second normally open terminal, a second normally closed terminal, a second armature, and a second coil, the second armature being connected to the second common terminal and being arranged to connect the second common terminal to the second normally open terminal when the second coil is energised and to otherwise connect the second common terminal to the second normally closed terminal, the second normally open terminal being connected to the first common terminal;
 a resistance connected between the first common terminal and the second normally closed terminal; and
 a switch connected between the first normally closed terminal and the second normally closed terminal.

2. The circuit of claim 1, further comprising a diode having its anode connected to the second normally closed terminal and its cathode connected to the second common terminal.

3. The circuit of claim 2, further comprising a capacitor connected between the second common terminal and the first normally closed terminal.

4. The circuit of claim 1, further comprising a diode having its anode connected to the second normally closed terminal and its cathode connected to the first normally open terminal.

5. The circuit of claim 4, further comprising a capacitor connected between the second common terminal and the first normally closed terminal.

6. The circuit of claim 1, further comprising a capacitor connected between the second common terminal and the first normally closed terminal.

7. The circuit of claim 1, further comprising:
   a sensor circuit arranged to sense a voltage representative of the voltage between the first normally closed terminal and the second common terminal; and
   a control circuit arranged to energise the first coil, energise the second coil, and/or open or close the switch, based on the voltage sensed by the sensor circuit.

8. The circuit of claim 1 wherein the switch is a semiconductor switch.

9. The circuit of claim 8, wherein the switch is an insulated gate bipolar transistor.

10. The circuit of claim 1, wherein the resistance is a resistor.

11. A method of operating an energy bypass circuit, the energy bypass circuit including a first relay and a second relay, the first relay having a first common terminal, a first normally open terminal, a first normally closed terminal, a first coil, and a first armature connected to the first common terminal, the second relay having a second common terminal, a second normally open terminal, a second normally closed terminal, a second coil, and a second armature connected to the second common terminal, the second normally open terminal connected to the first common terminal, the first armature arranged to connect the first common terminal to the first normally open terminal when the first coil is energised and to otherwise connect the first common terminal to the first normally closed terminal, the second armature arranged to connect the second common terminal to the second normally open terminal when the second coil is energised and to otherwise connect the second common terminal to the second normally closed terminal, the method comprising:
   determining that energy is to be provided to a capacitor;
   causing the coil of a first relay to be energised to enable the provision of energy to the capacitor via the first relay, a resistance connected between the first common terminal and the second normally closed terminal, and an unenergised second relay;
   determining that conditions for the initial provision of energy to the capacitor do not apply;
   causing the coil of the second relay to be energised to enable energy to be provided to the capacitor via the first relay and the second relay but not the resistance;
   determining that the voltage across the capacitor exceeds a predetermined threshold; and
   closing a switch connected between the first normally closed terminal and the second normally closed terminal to enable energy to discharge from the capacitor via the switch, the resistance, and second relay.

* * * * *